(12) United States Patent
Ausserlechner

(10) Patent No.: US 7,923,987 B2
(45) Date of Patent: Apr. 12, 2011

(54) MAGNETIC SENSOR INTEGRATED CIRCUIT WITH TEST CONDUCTOR

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 184 days.

(21) Appl. No.: 11/868,845

(22) Filed: Oct. 8, 2007

(65) Prior Publication Data

US 2009/0091344 A1 Apr. 9, 2009

(51) Int. Cl.
*G01R 1/20* (2006.01)
*G01R 31/28* (2006.01)

(52) U.S. Cl. .............. 324/126; 324/750.21; 324/754.17

(58) Field of Classification Search .......... 324/158.1, 324/760–765, 750–21, 754.17; 323/246, 323/257, 258; 702/59
See application file for complete search history.

(56) References Cited

U.S. PATENT DOCUMENTS

| | | | |
|---|---|---|---|
| 5,521,501 A | 5/1996 | Dettmann et al. | |
| 5,796,249 A | 8/1998 | Andraet et al. | |
| 6,069,476 A | 5/2000 | Vieux-Rochaz et al. | |
| 6,246,233 B1 | 6/2001 | Griffen et al. | |
| 6,300,758 B1 | 10/2001 | Griffen et al. | |
| 6,501,678 B1 * | 12/2002 | Lenssen et al. | 365/173 |
| 6,674,280 B1 * | 1/2004 | Goetz et al. | 324/207.21 |
| 6,731,105 B1 * | 5/2004 | Hoyle et al. | 324/117 R |
| 6,882,146 B2 | 4/2005 | Maiwald | |
| 7,030,601 B2 | 4/2006 | Buchhold | |
| 7,208,944 B2 | 4/2007 | Tatschl et al. | |
| 7,231,325 B2 | 6/2007 | Motz et al. | |
| 2001/0009367 A1 | 7/2001 | Seitzer et al. | |
| 2005/0278136 A1 | 12/2005 | Werth | |
| 2006/0202692 A1 | 9/2006 | Tatschl et al. | |
| 2007/0164734 A1 | 7/2007 | Shimizu et al. | |
| 2008/0274270 A1 * | 11/2008 | Wakui et al. | 427/128 |
| 2008/0285179 A1 * | 11/2008 | Yamashita | 360/319 |
| 2009/0243607 A1 * | 10/2009 | Mather et al. | 324/249 |

FOREIGN PATENT DOCUMENTS

| | | |
|---|---|---|
| CA | 2 083 008 | 11/1992 |
| DE | 4121374 A1 | 7/1993 |
| DE | 4319146 A1 | 12/1994 |
| DE | 19520206 | 12/1996 |
| DE | 10220911 | 12/2003 |
| DE | 103 26 988 B3 | 4/2005 |
| DE | 102005047413 | 9/2006 |
| WO | 9848291 | 10/1998 |

OTHER PUBLICATIONS

Infineon Technologies, Data Book entitles "6.6 Application Notes: Differentail Hall IC TLE 4921-3U," Jul. 2000; pp. 31-51.
Infineon Technologies, Target Data Sheet entitled "TLE 5011 GMR Based Angular Sensor," V.01, Apr. 2007; 56 pgs.
Infineon Technologies, Preliminary Data Sheet entitled "TLE 5010 GMR Based Angular Sensor," V.09, May 2007; 56 pgs.
J. Zimmer, US application entitled "Integrated Circuit Including Magneto-Resistive Structures," U.S. Appl. 11/845,440, filed Aug. 27, 2007.

* cited by examiner

*Primary Examiner* — Ha Tran T Nguyen
*Assistant Examiner* — Trung Q Nguyen
(74) *Attorney, Agent, or Firm* — Dicke, Billig & Czaja, PLLC

(57) ABSTRACT

A magnetic sensor integrated circuit includes a plurality of magnetically sensitive elements, and at least one test conductor positioned adjacent to at least one of the magnetically sensitive elements and configured to generate a differential magnetic field that is adapted to be applied to the plurality of magnetically sensitive elements during a test mode.

16 Claims, 8 Drawing Sheets

MAGNETIC SENSOR INTEGRATED CIRCUIT WITH TEST CONDUCTOR

BACKGROUND

Some magnetic speed sensors are configured to measure the speed of a magnetic tooth wheel. Such speed sensors typically include an integrated circuit with a plurality of magnetic sensor elements, such as Hall sensor elements or xMR sensor elements (e.g., GMR—giant magneto resistance; AMR—anisotropic magneto resistance; TMR—tunnel magneto resistance; CMR—colossal magneto resistance). A permanent magnet provides a bias magnetic field to the sensor elements. As the wheel is rotated, the teeth of the wheel pass in front of the sensor and generate a small field variation, which is detected by the integrated circuit. The detected field contains information about the angular position and rotational speed of the wheel.

It is desirable to be able to test magnetic sensors, such as magnetic tooth wheel speed sensors, to help ensure that the sensors are operating properly. One method for testing a magnetic sensor is to use a magnetic core to apply test differential magnetic fields to the sensor, and measure the sensor response. One problem with using such an external magnetic field source is that there must be a precise alignment between the magnetic core and the sensor under test. Position errors can result in inaccurate test results.

SUMMARY

One embodiment provides a magnetic sensor integrated circuit. The integrated circuit includes a plurality of magnetically sensitive elements, and at least one test conductor positioned adjacent to at least one of the magnetically sensitive elements and configured to generate a differential magnetic field that is adapted to be applied to the plurality of magnetically sensitive elements during a test mode.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
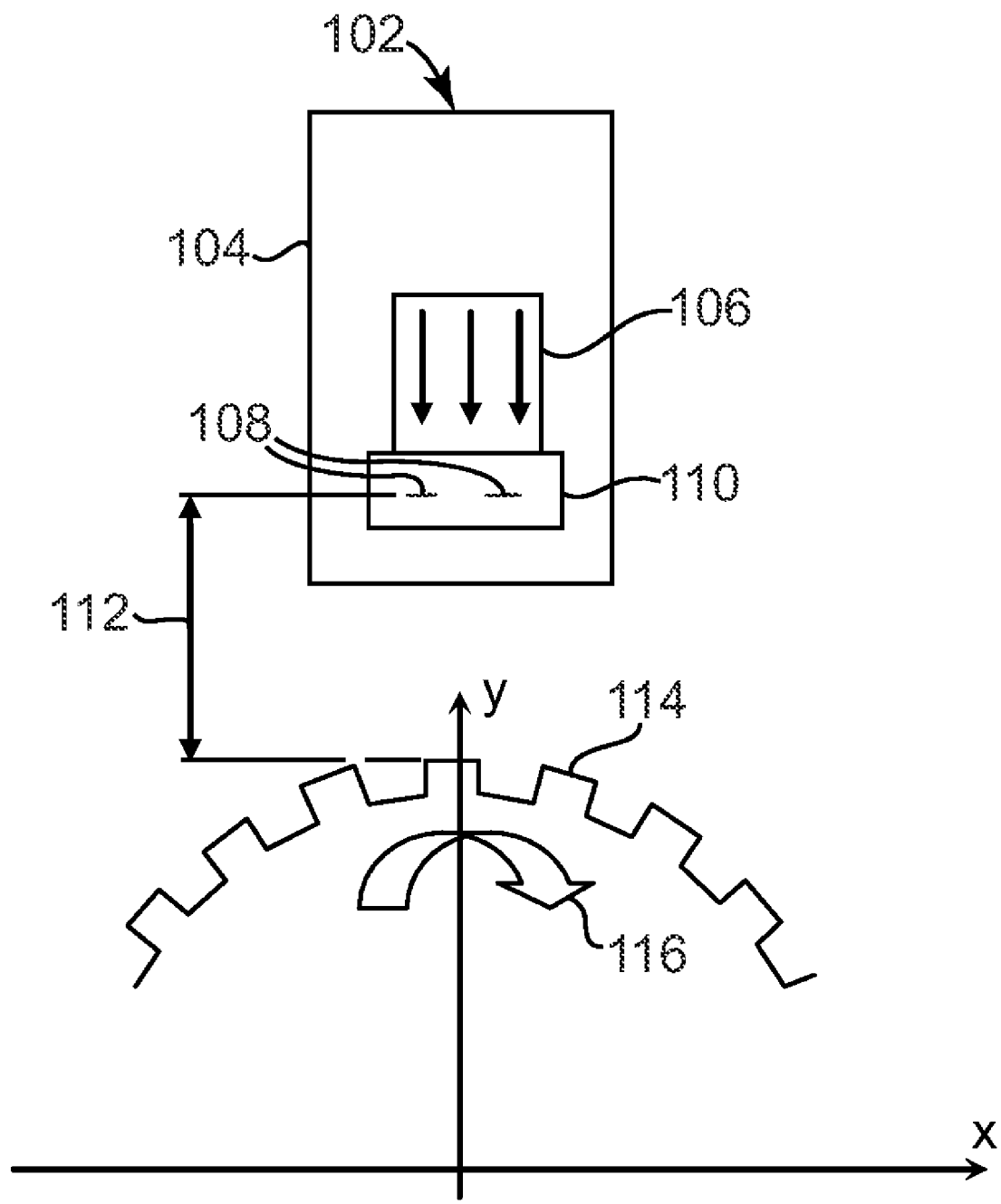
FIG. 1 is a diagram illustrating a prior art speed sensor for sensing the speed of a magnetic tooth wheel.

FIG. 1 is a diagram illustrating a prior art speed sensor 102 for sensing the speed of a magnetic tooth wheel 114. The speed sensor 102 includes a permanent magnet 106 and a magnetic sensor integrated circuit 110 surrounded by a protective cover 104. The magnetic sensor integrated circuit 110 includes a plurality of magnetically sensitive elements 108, such as Hall sensor elements or xMR sensor elements (e.g., GMR—giant magneto resistance; AMR—anisotropic magneto resistance; TMR—tunnel magneto resistance; CMR—colossal magneto resistance). The permanent magnet 106 provides a bias magnetic field to the elements 108. In the illustrated embodiment, the bias magnetic field is perpendicular to the plane of the integrated circuit 110 (e.g., in the Y-direction). The elements 108 are separated from the magnetic tooth wheel 114 by an air gap distance 112. As the wheel 114 is rotated in the direction shown by arrow 116, the teeth of the wheel 114 pass in front of the sensor 102 and generate a small field variation, which is detected by the integrated circuit 110. The detected field contains information about the angular position and rotational speed of the wheel 114. The waveform of the field is nearly sinusoidal and its amplitude decreases drastically with the air gap 112.

Figure 2:
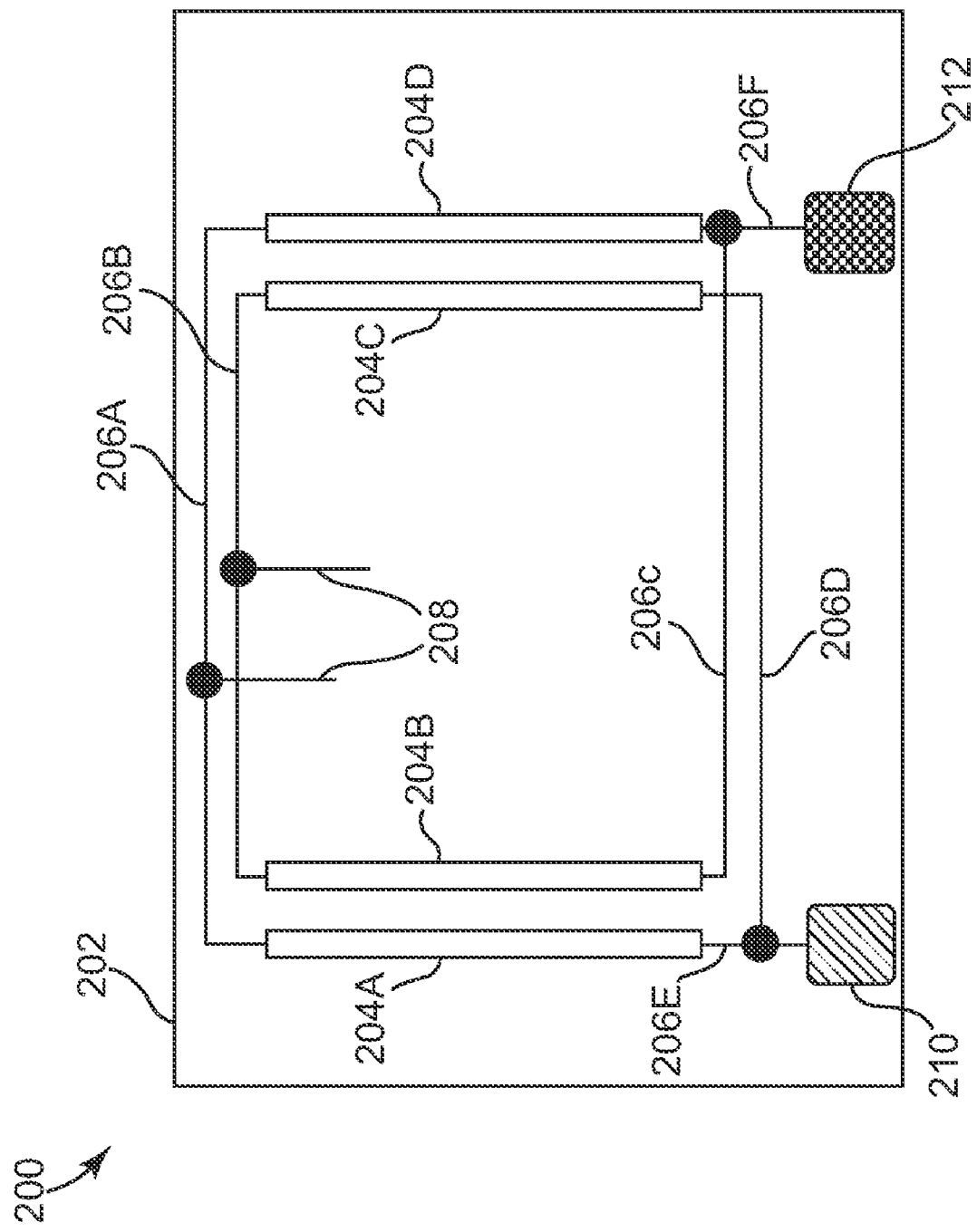
FIG. 2 is a diagram illustrating a top view of a magnetic sensor integrated circuit according to one embodiment.

FIG. 2 is a diagram illustrating a top view of a magnetic sensor integrated circuit 200 according to one embodiment. In one embodiment, magnetic sensor 200 is configured as a speed sensor, such as a speed sensor to sense the speed or position of a magnetic tooth wheel. Magnetic sensor 200 includes a semiconductor die 202, magnetically sensitive elements 204A-204D, interconnects 206A-206F, output terminals 208, supply pad 210, and ground pad 212. The magnetically sensitive elements 204A-204D are connected together and to pads 210 and 212 via interconnects 206A-206F. Magnetic sensor 200 is configured as a full bridge with two magnetically sensitive elements 204A-204B on the left hand side of the die 202, and two elements 204C-204D on the right hand side of the die 202. In another embodiment, magnetic sensor 200 is configured as a half bridge having two magnetically sensitive elements, with one element on the left hand side of the die 202, and one element on the right hand side of the die 202. In yet another embodiment, die 202 also includes an additional magnetically sensitive element at the center of the die 202 for direction measurement. In one embodiment, the magnetically sensitive elements 204A-204D are xMR elements.

In operation according to one embodiment, a voltage is applied to supply pad 210 causing a current to flow through the elements 204A-204D to ground pad 212. In response to an external magnetic field, one or more of the magnetically sensitive elements 204A-204D change in electrical resistance, causing a voltage signal at the output terminals 208. If a differential magnetic field is applied to sensor 200, such that the magnetic field vector points to the right at the right half of the die 202 and to the left at the left half of the die 202 (or vice versa), the output signal is positive or negative. Since magnetic sensor 200 is configured to process differential magnetic fields, the sensor 200 is insensitive to homogenous magnetic fields.

It is desirable to be able to test magnetic sensors, such as sensor 102 or sensor 200, to help ensure that the sensors are operating properly. One embodiment provides a magnetic sensor integrated circuit that includes at least one test conductor integrated on-chip to generate differential magnetic fields during a test mode of the chip. In one embodiment, a homogeneous magnetic field that is generated off-chip is also applied to the chip during the test mode. The magnetic fields applied to the magnetic sensor during the test mode are used to test the functionality of the sensor. The system and method according to one embodiment do not suffer from the position tolerance problems of prior testing techniques.

Figure 3:
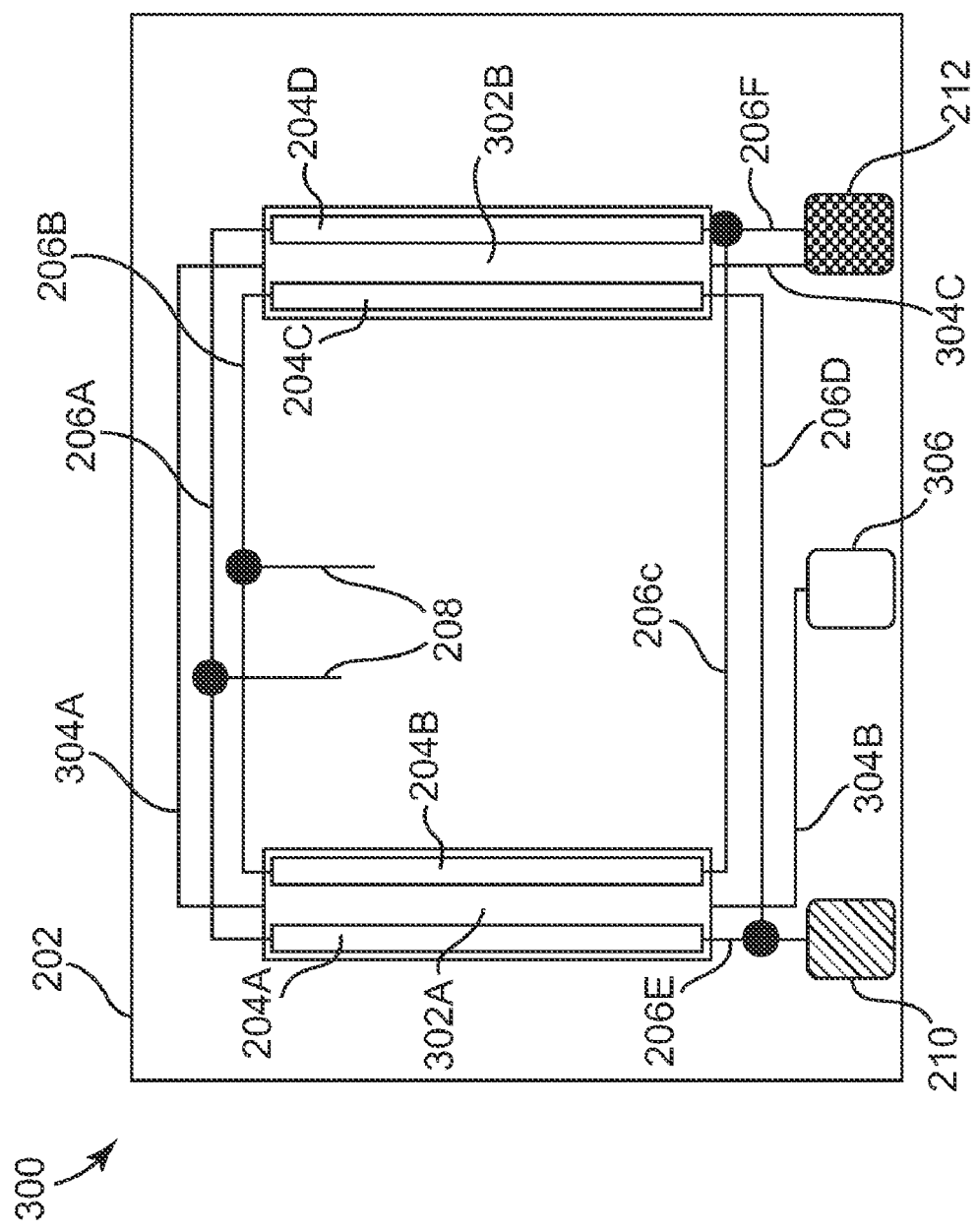
FIG. 3 is a diagram illustrating the magnetic sensor integrated circuit shown in FIG. 2 with the addition of test conductors that are positioned adjacent to the magnetically sensitive elements according to one embodiment.

FIG. 3 is a diagram illustrating the magnetic sensor integrated circuit shown in FIG. 2 with the addition of test conductors 302A and 302B that are positioned adjacent to the magnetically sensitive elements 204A-204D according to one embodiment. In the illustrated embodiment, magnetic sensor 300 includes the same elements as magnetic sensor 200 (FIG. 2), but also includes test conductors 302A and 302B, interconnects 304A-304C, and current-in pad 306. As shown in FIG. 3, test conductor 302A is positioned underneath magnetically sensitive elements 204A and 204B, and test conductor 302B is positioned underneath magnetically sensitive elements 204C and 204D. In another embodiment, test conductors 302A and 302B are each two separate conductors, such that each magnetically sensitive element 204A-204D has a separate test conductor positioned underneath it. In one embodiment, test conductors 302A and 302B are positioned within 5 μm or less of the magnetically sensitive elements 204A-204D, and run parallel with the magnetically sensitive elements 204A-204D for at least about 25% of the length of the magnetically sensitive elements 204A-204D. In one specific embodiment, the test conductors 302A and 302B are positioned underneath the magnetically sensitive elements 204A-204D at a distance of about 600 nm away from the elements 204A-204D. In another embodiment, the test conductors 302A and 302B are positioned above the magnetically sensitive elements 204A-204D. The test conductors 302A and 302B are electrically isolated from the magnetically sensitive elements 204A-204D by an oxide layer in one embodiment. Test conductors 302A and 302B are connected together via interconnect 304A. Test conductor 302A is connected to current-in pad 306 via interconnect 304B. Test conductor 302B is connected to ground pad 212 via interconnect 304C. In one embodiment, magnetic sensor 300 has a total chip area of less than about 10 mm.

In operation according to one embodiment, a voltage is applied to or a current is injected into current-in pad 306, causing a current to flow through the test conductors 302A and 302B to ground pad 212. In one embodiment, conductor 302A generates a magnetic field that points to the left for the left two elements 204A-204B and conductor 302B generates a magnetic field that points to the right for the right two elements 204C-204D when a current flows through the conductors. In another embodiment, conductor 302A generates a magnetic field that points to the right for the left two elements 204A-204B and conductor 302B generates a magnetic field that points to the left for the right two elements 204C-204D when a current flows through the conductors. Thus, the test conductors 302A and 302B generate a differential magnetic field on the magnetic sensor 300. In one embodiment, test conductors 302A and 302B generate magnetic field components that are substantially parallel to the surface or plane of the sensor 300 over the entire length or substantially the entire length of the magnetically sensitive elements 204A-204D. The magnetic sensor 300 processes the signals generated by the magnetically sensitive elements 204A-204D in the test mode in a normal manner (i.e., in the same manner that the signals are processed in a normal mode of operation), and generates corresponding output signals.

Figure 4:
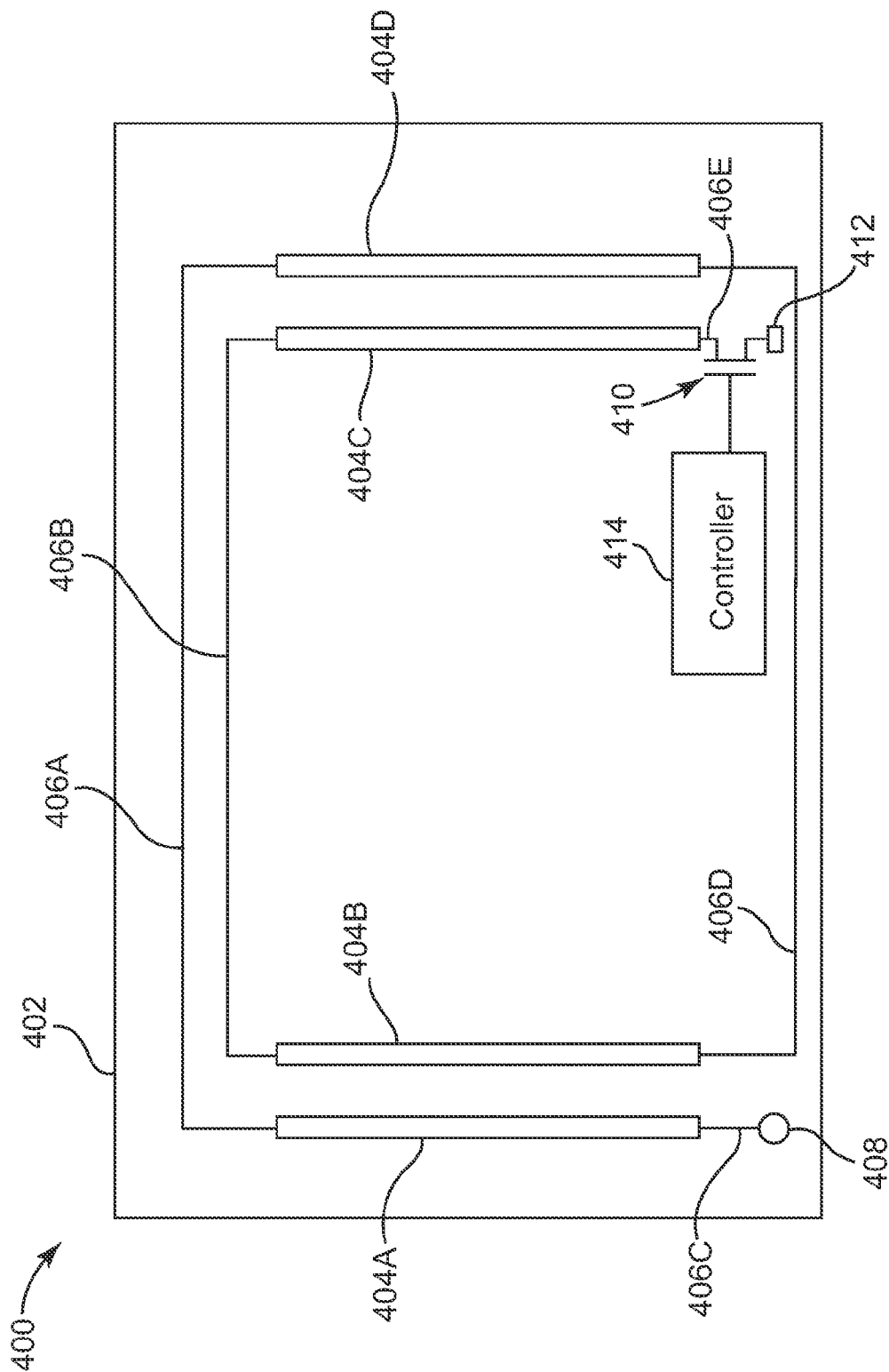
FIG. 4 is a diagram illustrating a top view of a magnetic sensor integrated circuit according to another embodiment.

FIG. 4 is a diagram illustrating a top view of a magnetic sensor integrated circuit 400 according to another embodiment. Magnetic sensor 400 includes a semiconductor die 402, test conductors 404A-404D, interconnects 406A-406E, supply pad 408, transistor 410, ground pad 412, and controller 414. In one embodiment, magnetic sensor 400 also includes four magnetically sensitive elements (not shown in FIG. 4), such as xMR elements, with one magnetically sensitive element being positioned over each of the test conductors 404A-404D. The test conductors 404A-404D are connected together, and to supply pad 408 and transistor 410, via interconnects 406A-406E.

Test conductors 404A-404D are connected in series between supply pad 408 and transistor 410. Transistor 410 connects the conductors 404A-404D to ground pad 412. In one embodiment, transistor 410 is an NMOS FET, with a drain connected to interconnect 406E, a source connected to ground pad 412, and a gate that is connected to a controller 414 within the integrated circuit 400, which causes the transistor 410 to be turned on and off during the test mode. When transistor 410 is turned on, current flows through the conductors 404A-404D, thereby generating a differential magnetic field that is applied to the xMR elements.

In one embodiment, the drain of transistor 410 is also connected to a test pad or bond pad (not shown). In this embodiment, the current through the conductors 404A-404D can be measured by connecting the test pad or bond pad via an ammeter to ground while the transistor 410 is off. In one embodiment, transistor 410 is a high-voltage NMOS device with a drain enhancement (e.g., a larger distance between gate and drain, so that there is a high voltage drop between gate and drain without excessive electric field), and with a width-to-length ratio (W/L) of about 100 to 5000. In another embodiment, the W/L ratio of transistor 410 is about 1000 or higher. In one embodiment, transistor 410 is implemented with two NMOS devices of equal size that are electrically connected in parallel and that share a common source. In another embodiment, transistor 410 is a PMOS FET. However, due to the smaller mobility of PMOS FETs, more space on the die is typically needed.

In the embodiment shown in FIG. 4, transistor 410 is configured as a single-transistor switch. In another embodiment, multiple transistors in a current mirror configuration are used in place of transistor 410. A current mirror can generate a well-defined output current that is a variable portion or multiple of an input current. The current mirror configuration is useful if the current and magnetic field are to be changed (e.g., lowered to verify operation at a smallest possible air-gap for an application).

In one embodiment, the magnetically sensitive elements on the left hand side of the magnetic sensors 102, 200, 300, and 400 are separated from the magnetically sensitive elements on the right hand side of the sensors by a distance of greater than about 0.2 mm. In one specific embodiment, the spacing is about 2.5 mm. In one embodiment, the magnetically sensitive elements and the test conductors are each about 1.4 mm long. In one embodiment, the integrated test conductors (e.g., conductors 302A-302B and 404A-404D) are each 4 μm wide or narrower. In one embodiment, the interconnects between the integrated test conductors (e.g., interconnects 304A and 406A, 406B, and 406D) are each about 2.5 mm long and 20 μm wide.

In one embodiment, the supply pad 408 for the test conductor is identical to a supply pad of functional parts of the integrated circuit 400. In a specific embodiment, the supply pad 408 is identical to the overall supply pad of the entire integrated circuit 400.

Figure 5:
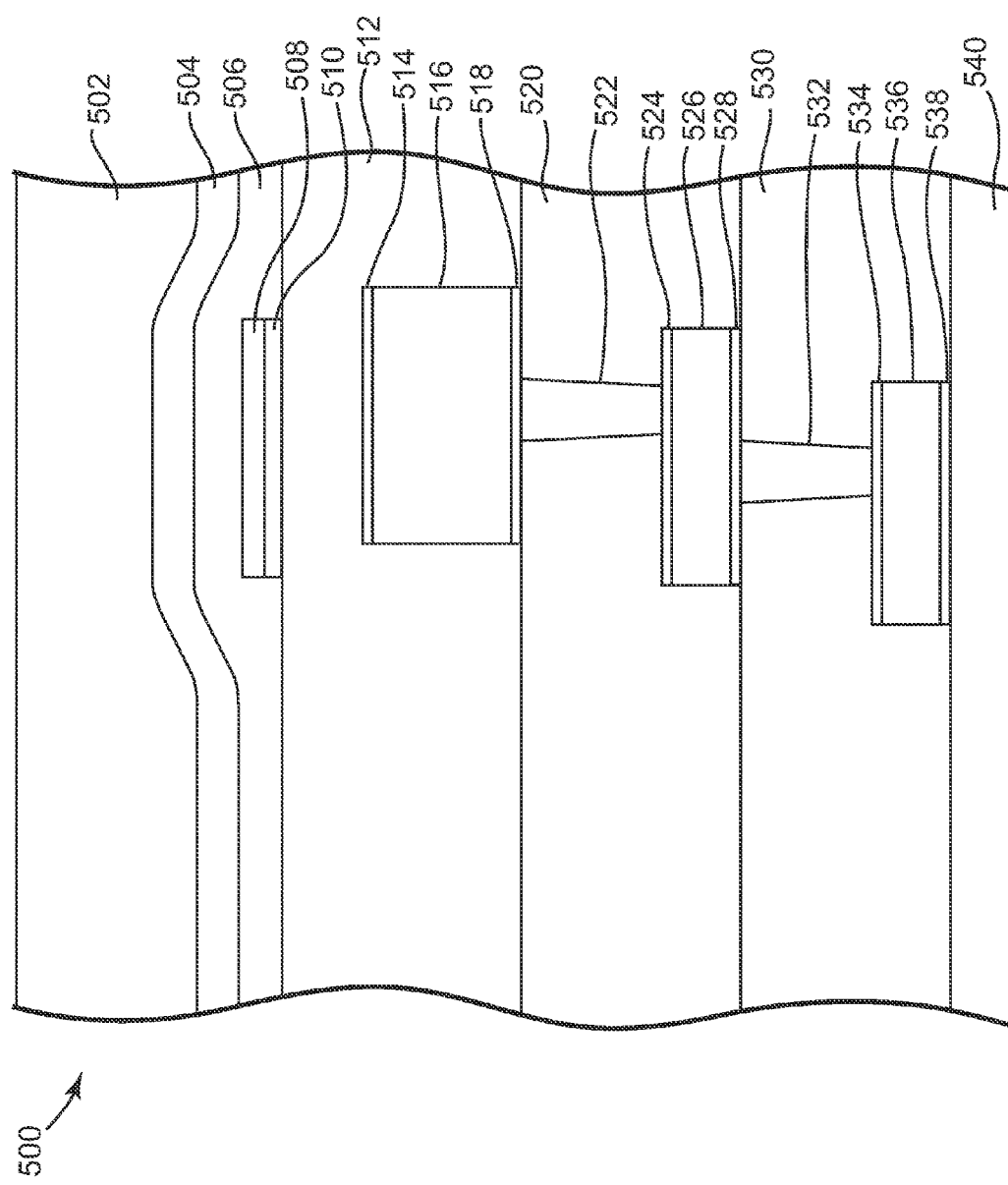
FIG. 5 is a diagram illustrating a cross-sectional view of a magnetic sensor integrated circuit according to one embodiment.

FIG. 5 is a diagram illustrating a cross-sectional view of a magnetic sensor integrated circuit 500 according to one embodiment. Positioned at the bottom of the magnetic sensor 500 is a silicon substrate layer 540. In one embodiment, transistor 410 (FIG. 4) is formed in substrate layer 540. In the illustrated embodiment, magnetic sensor 500 includes three metal layers or interconnect layers—metal-1 layer 536, metal-2 layer 526, and GMR-metal layer 516. Each of the metal layers 516, 526, and 536 includes a top and a bottom coating. Metal-1 layer 536 includes a top coating 534 and a bottom coating 538. Metal-2 layer 526 includes a top coating 524 and a bottom coating 528. GMR-metal layer 516 includes a top coating 514 and a bottom coating 518. In one embodiment, each of the coating layers is either titanium or titanium nitride (TiN), or a combination of titanium and TiN. The metal layers 516, 526, and 536 may be connected together and to other elements in magnetic sensor 500 with vias, such as the vias 522 and 532 shown in FIG. 5. Oxide layers 512, 520, and 530 are formed over the metal layers 516, 526, and 536, respectively, and provide electrical isolation between the metal layers.

FIG. 5 also shows an xMR element 510 formed on the oxide layer 512. An oxide hard mask layer 508 is formed on the xMR element 510, and an oxide layer 506 is formed over the mask layer 508 and the xMR element 510. A nitride layer 504 is formed on the oxide layer 506. A photoimide layer 502 is formed on the nitride layer 504.

In one embodiment, the test conductors 302A-302B (FIG. 3) and 404A-404D (FIG. 4) are made from metal at the GMR-metal layer 516. The GMR-metal layer 516 is closest to the xMR element 510, and it is the thickest and has the smallest sheet resistance of the three metal layers shown in FIG. 5. In one embodiment, the conductor interconnects (e.g., interconnects 304A-304C and 406A-406E) are also made from metal at the GMR-metal layer 516. In another embodiment, the interconnects are made from metal at the metal-2 layer 526 or the metal-1 layer 536, and the width of the interconnects is increased in order to keep the resistance constant. In one embodiment, the test conductors 302A-302B and 404A-404D each have a resistance of 20.5 Ohms, and each of the interconnects has a resistance of 7.3 Ohms. If the transistor 410 (FIG. 4) is positioned below the right magnetically sensitive elements (e.g., elements 204C-204D), and is made large with an Rds on-resistance of less than 2 Ohms for a 3V gate-drive, and if the drain and the source of the transistor 410 have a contact resistance of 5 Ohms, then for a supply voltage of +3V, the resulting current through the test conductors in the test mode is 25.9 mA (i.e., 3V/(4*20.5+3*7.3+5+2+5)=25.9 mA). This current generates a 2.8 mT (milli-Tesla) magnetic field at the magnetically sensitive elements. The current is low enough to be generated on-chip during the test mode, and the field is similar to those applied in actual applications.

As mentioned above, the test conductors 302A-302B and 404A-404D are made from metal at the GMR-metal layer 516 in one embodiment. In another embodiment, additional test conductors are formed at the metal-2 layer 526 below the test conductors at the GMR-metal layer 516, and the additional test conductors are connected in series with the test conductors at the GMR-metal layer 516. In this embodiment, the overall resistance increases, the current decreases to 11 mA, and the magnetic excitation generated by the test conductors decreases to 2.0 mT. In another embodiment, rather than reducing the current with additional test conductors at multiple metal layers, the current is reduced by controlling the current with a current mirror in place of transistor 410.

If the current through the integrated test conductors 302A-302B or 404A-404D is generated on-chip, it is typically subject to process spreads. If this current is not accessible to a tester, it may not be possible to calibrate the magnetic sensitivity of the sensor (i.e., the ratio of the output of the sensor to the magnetic field magnitude) using this current. Since the on-chip generated current is not precisely known, the magnetic field resulting from this current is not precisely known. In one embodiment, the on-chip generated current is made accessible to a tester for measurement via a test pad (e.g., during wafer level test). The on-chip generated current may also be trimmed during a wafer level test so that it remains precise and well defined during subsequent operation and tests (e.g., during a package level test).

Figure 6:
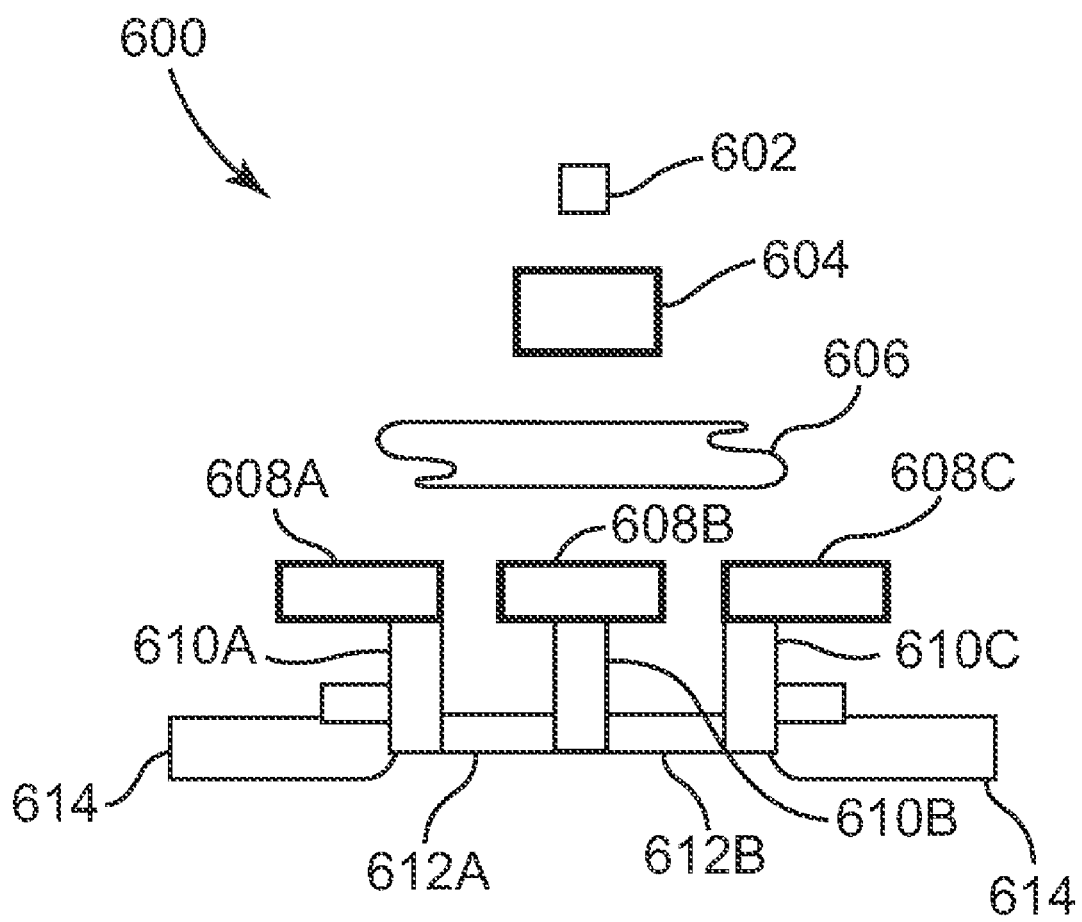
FIG. 6 is a diagram illustrating a simplified cross-sectional view of a magnetic sensor integrated circuit according to one embodiment.

FIG. 6 is a diagram illustrating a simplified cross-sectional view of a magnetic sensor integrated circuit 600 according to one embodiment. Magnetic sensor 600 includes a magnetically sensitive element 602 (e.g., an xMR element), a test conductor 604, a metal-2 line 606, metal-1 lines 608A-608C, contacts 610A-610C, NMOS transistor channels 612A and 612B, and oxide layer 614. As mentioned above, in one embodiment, transistor 410 (FIG. 4) is implemented with two NMOS devices of equal size that are electrically connected in parallel and that share a common source. Contacts 610A and 610C connect the two drains of the transistor 410 to metal-1 lines 608A and 608C, respectively. Contact 610B connects the source of the transistor 410 to metal-1 line 608B. The positioning of the transistor 410 underneath the magnetically sensitive element 602 results in good thermal coupling of the element 602 to the substrate.

Figure 7:
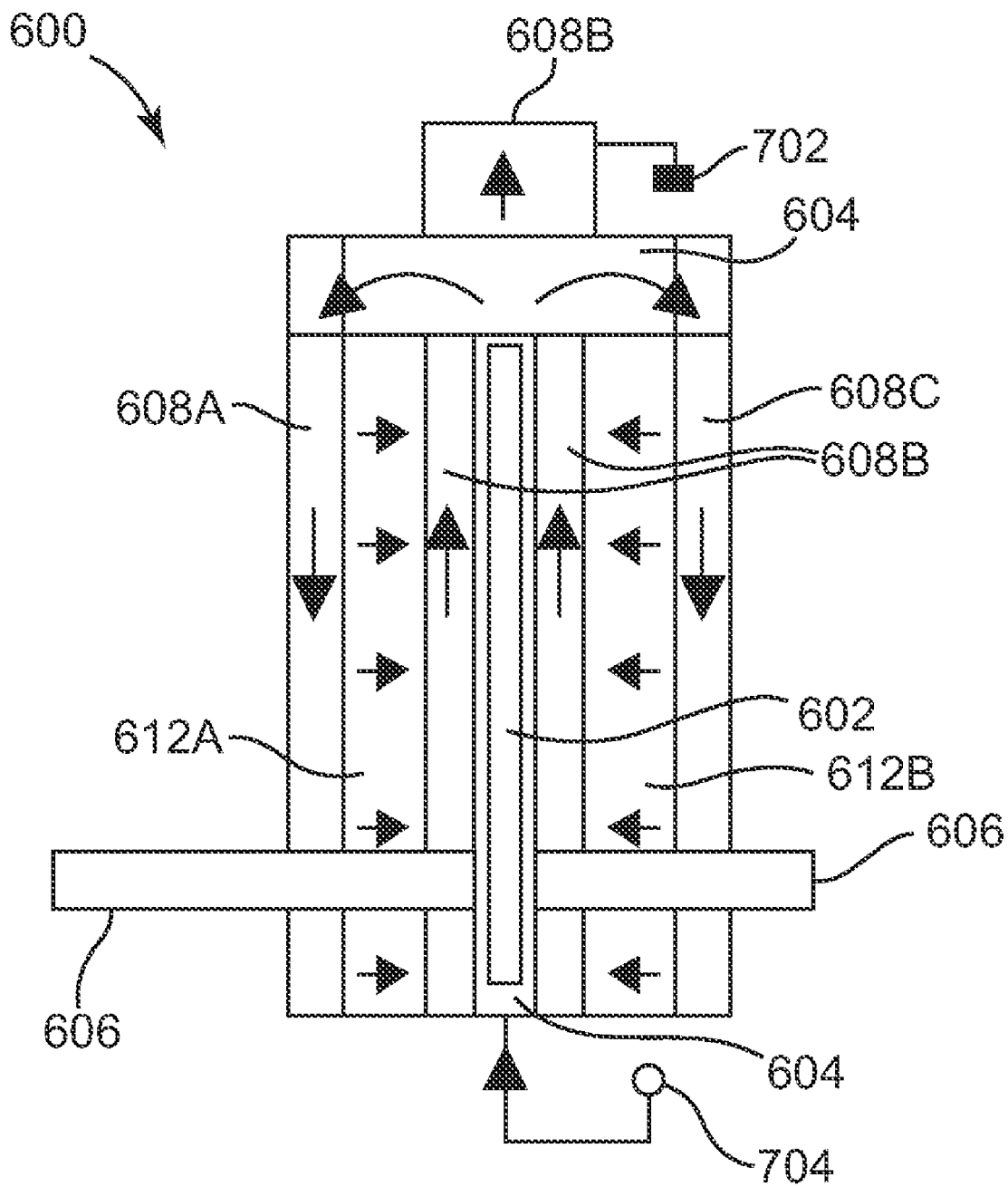
FIG. 7 is a diagram illustrating a top view of the magnetic sensor integrated circuit shown in FIG. 6 according to one embodiment.

FIG. 7 is a diagram illustrating a top view of the magnetic sensor integrated circuit 600 shown in FIG. 6 according to one embodiment. During a test mode of the sensor 600, a current is applied to a supply pad 704. The arrows in FIG. 7 show how the current flows from the supply pad 704 through the magnetic sensor 600 to ground pad 702. The current begins at the supply pad 704 and flows upward through test conductor 604. At the top of the conductor 604, the current branches left and right and then flows downward through metal-1 lines 608A and 608C. The metal-1 lines 608A and 608C correspond to the two drains of the transistor 410. The current from the left side drain (i.e., metal-1 line 608A) flows rightward through channel 612A, and the current from right side drain (i.e., metal-1 line 608C) flows leftward through channel 612B. The current from the drains then enters the metal-1 line 608B, which corresponds to the source of the transistor 410. The current flows upward through the metal-1 line 608B and into the ground pad 702.

In the illustrated embodiment, the current in the two metal-1 lines 608A and 608C flows downward, which is the opposite direction of the current through the test conductor 604. Thus, the current through the two metal-1 lines 608A and 608C reduces the magnetic field on the magnetically sensitive element 602. However, in one embodiment, the two metal-1 lines 608A and 608C are positioned sufficiently distant from the element 602, and are made sufficiently broad (e.g., to reduce the current density through these lines), so that their influence on the element 602 is small. The current in the metal-1 line 608B is upward, which is the same direction as the current through the test conductor 604. Thus, the current through the metal-1 line 608B generates a magnetic field on the element 602 that adds to the field generated by the test conductor 604, which is beneficial.

Figure 8:
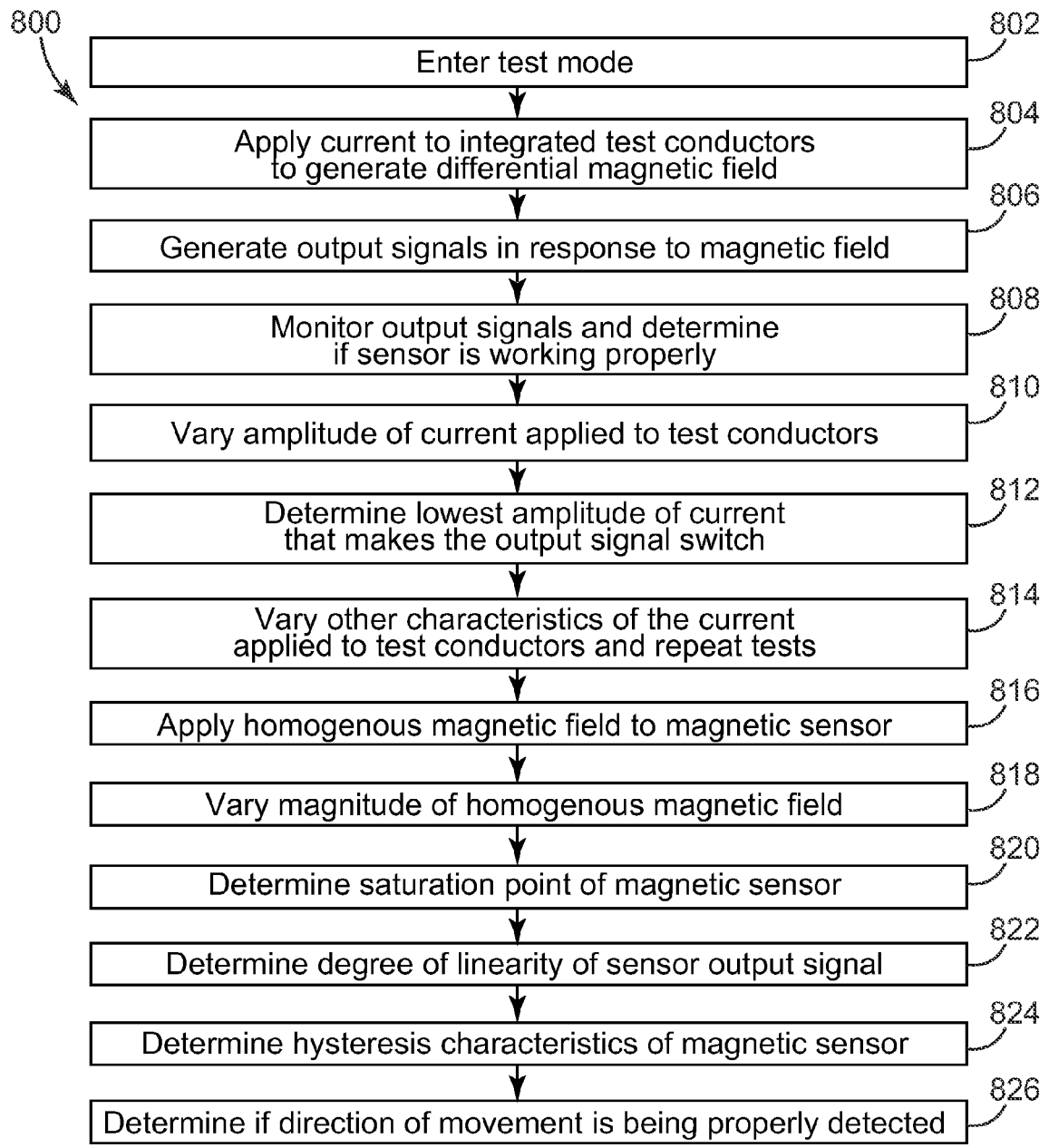
FIG. 8 is a flow diagram illustrating a method of testing a magnetic sensor integrated circuit according to one embodiment.

FIG. 8 is a flow diagram illustrating a method 800 of testing a magnetic sensor integrated circuit (e.g., magnet sensor 300 or 400) according to one embodiment. At 802, the magnetic sensor enters a test mode. At 804, a current is applied to at least one test conductor integrated into the magnetic sensor (e.g., test conductors 302A-302B or 404A-404D). In one embodiment, the current is a pulsed current that causes the test conductors to produce a pulsed differential magnetic field on magnetically sensitive elements within the magnetic sensor (e.g., elements 204A-204D). In one embodiment, the current applied to the test conductors is in the range of about 0 to about 50 mA, and is pulsed at frequencies in the range of about 5 Hz to about 50 kHz.

At 806, the magnetic sensor processes the signals produced by the magnetically sensitive elements, and generates output signals in response to the pulsed magnetic field. In one embodiment, the magnetic sensor processes signals and generates output signals in the test mode in the same manner as in a normal mode of operation. For example, the output signal of the magnetic sensor will go high if the magnetic field on the magnetically sensitive elements on the right side of the chip is larger than the field on the left side (e.g., Bx(right)−Bx(left) >0), and the output signal of the magnetic sensor will go low if the magnetic field on the magnetically sensitive elements on the left side of the chip is larger than the field on the right side (e.g., Bx(right)−Bx(left)<0).

At 808, the output signal generated by the magnetic sensor is monitored to determine if the magnetic sensor is working properly and according to specifications. In one embodiment, it is determined at 808 whether the output signal switches states at all (i.e., goes from high to low and/or from low to high). In one embodiment, the time delay between the transition (i.e., rising or falling edge) of the pulsed current through the integrated test conductors and the corresponding transition of the output signal of the magnetic sensor is also determined at 808. It is straightforward to measure the time when the pulsed current has a transition if this current is supplied to the magnetic sensor by an external source. If the current is generated on-chip, the transition can be detected by monitoring the overall current consumption of the magnetic sensor.

In one embodiment, the magnetic sensitivity of the magnetic sensor is also determined at 808, and it is determined whether the magnetic sensitivity is within a proper range. For some magnetic sensor integrated circuits, the signal processing circuitry of the magnetic sensor extracts the amplitude of the signals generated by the magnetically sensitive elements. For such magnetic sensors, the amplitude of these signals and the amplitude of the current through the integrated test conductors are used to determine the magnetic sensitivity of the sensor.

In one embodiment, the phase-jitter of the output signal is also determined at 808. This determination may be a little more difficult for current pulses that are generated on-chip, since the current pulses may exhibit significant jitter themselves (e.g., because the current pulses are controlled by an on-chip oscillator in one embodiment, which could have a poor quality factor if no quartz is used). Nevertheless, the jitter of the output signal can be compared to the jitter of the current pulses on the supply line. The difference of the two values is a measure of jitter performance of the magnetic sensor signal processing circuit. The jitter of the current pulses on the supply line is a measure of the quality of the on-chip oscillator. Thus, jitter-performance of the oscillator and the signal processing circuitry may be separately determined.

Generally, the phase jitter of the output signal in response to external fields will be much larger than the fields generated by the integrated test conductors, because these external fields are asynchronous to the on-chip oscillator. A primary reason for jitter in the output signal is that the sensor system samples the magnetic field asynchronously to its transitions and thus may be delayed by up to half a period of the cycle frequency. To this end, it may be advantageous to use an auxiliary oscillator, which runs asynchronously to the main oscillator. The auxiliary oscillator is started only during the test mode and serves to generate asynchronous current pulses.

At 810, the amplitude of the pulsed current applied to the integrated test conductors is varied. If the current is supplied to the integrated test conductors via a test pad of the magnetic sensor during a wafer level test, different currents are injected into the test pad at 810. If the current is supplied via a bond pad after the magnetic sensor has been packaged, different currents are injected into the bond pad at 810. If the current is generated on-chip, in one embodiment, the current is controlled by a signal that is provided via a pad on the magnetic sensor or by a digital code that is transferred to the magnetic sensor via a data interface protocol when entering the test mode. At 812, the lowest amplitude that makes the output signal switch is determined.

At 814, characteristics of the current through the integrated test conductors are varied, and one or more of the tests or determinations performed at 808 and 812 are repeated. In one embodiment, the polarity, amplitude, frequency, or duty-cycle of the current pulses applied to the integrated test conductors are varied at 814. In one embodiment, the current pulses are changed at 814 from bipolar current pulses to unipolar current pulses, or vice versa. In one embodiment, the magnetic sensor is configured to selectively apply current pulses only to selected ones of the integrated test conductors in order to test the characteristics of individual ones of the magnetically sensitive elements of the magnetic sensor.

At 816, a homogeneous magnetic field is applied to the entire magnetic sensor at the same time that a pulsed differential magnetic field is being generated by the integrated test conductors. In one embodiment, the homogenous magnetic field is applied to the magnetic sensor by placing the sensor in a large coil that generates the homogeneous magnetic field. In one embodiment, the homogenous magnetic field is parallel to the plane of the integrated circuit (e.g., in the x-direction, which is the sensitive direction for GMRs). In other embodiments, the homogeneous magnetic field is applied to the integrated circuit in the y-direction (e.g., perpendicular to the plane of the integrated circuit) or in the z-direction (e.g., parallel to the plane of the integrated circuit and parallel to the current flow through the GMRs). When the field is applied in the y or z direction, the performance of the integrated circuit will typically decrease (e.g., the hysteresis will typically increase), and such a field is useful in determining the effects of a misalignment of the permanent magnet used in actual implementations.

At 818, the magnitude and sign of the homogenous magnetic field is varied. In one embodiment, the homogenous magnetic field is ramped upward at 818 from −20 mT to +20 mT. At 820, the saturation point of the magnetic sensor is determined. The repetitive pulsed current applied to the integrated test conductors produces a pulsed differential magnetic field, which makes the output signal of the magnetic sensor switch. If the magnetic sensor saturates at, for example, +/−10 mT, the output signal of the magnetic sensor will stop switching when the magnitude of the homogenous magnetic field exceeds +/−10 mT.

At 822, the degree of linearity of the magnetic sensor output signal versus magnetic field strength is determined. The degree of linearity may be determined by comparing the measured amplitudes of the magnetic sensor output signal to the magnitudes of the homogenous magnetic field.

At 824, hysteresis characteristics of the magnetic sensor are determined. The hysteresis characteristics may be determined by monitoring the sensor output signal while the homogenous magnetic field is ramped up to a maximum value, and then ramped down to zero, and preferably ramped down to a maximum negative value, and then ramped up to zero again.

At 826, it is determined whether the magnetic sensor is properly detecting direction of movement. Typically, direction detection is accomplished by the use of an additional magnetically sensitive element that is placed in the center of the die (e.g., a direction xMR element). In one embodiment, an additional test conductor is positioned below the direction xMR element to separately produce its own test magnetic field independent of the magnetic fields produced by the other test conductors. In another embodiment, a magnetic field is applied to the direction xMR element via an external source, such as the homogenous magnetic field applied at 816. If the amplitude of the applied magnetic signal is small compared to the saturation point of the magnetic sensor (e.g., only a few mT), the small magnetic field will add linearly to the small fields of the outer integrated test conductors (i.e., the integrated conductors positioned below the speed xMR elements). If the magnetic sensor is a first order gradiometer, its output will not respond to this homogeneous background field. Therefore, the homogeneous background field acts only on the direction xMR element, whereas the field generated by the on-chip test conductors acts only on the speed xMR elements. Thus, the direction xMR element and the speed xMR elements can be tested independently.

In order to simulate operation in the field, the direction field (e.g., the homogenous magnetic field applied to the magnetic sensor) should be out of phase with the speed-field (i.e., the magnetic field applied to the speed xMR elements by the integrated conductors). If the speed field is generated on-chip, the phase of the speed field can be detected by monitoring the current pulses on the supply line of the chip. The phase difference between the speed field and the direction field, as well as the amplitude, frequency, and duty-cycle of both fields can be varied to determine if the magnetic sensor is properly detecting direction of movement.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A magnetic sensor integrated circuit, comprising:
a plurality of magnetically sensitive elements;
at least one test conductor positioned within the integrated circuit adjacent to at least one of the magnetically sensitive elements and configured to conduct a current that generates a differential magnetic field that is adapted to be applied to the plurality of magnetically sensitive elements during a test mode, wherein the differential magnetic field points in a first direction for a first set of the magnetically sensitive elements and points in a second direction opposite to the first direction for a second set of the magnetically sensitive elements; and
a circuit for varying an amplitude of the current through the at least one test conductor and determining a lowest amplitude of the current that makes an output signal switch states.

2. The integrated circuit of claim 1, wherein the magnetically sensitive elements are one of giant magneto resistance (GMR) elements, anisotropic magneto resistance (AMR) elements, tunnel magneto resistance (TMR) elements, or colossal magneto resistance (CMR) elements.

3. The integrated circuit of claim 1, wherein the plurality of magnetically sensitive elements comprises at least four magnetically sensitive elements in a full bridge configuration.

4. The integrated circuit of claim 3, wherein the at least one test conductor comprises two test conductors, and wherein a first one of the test conductors is positioned under a first two of the magnetically sensitive elements, and wherein a second one of the test conductors is positioned under a second two of the magnetically sensitive elements.

5. The integrated circuit of claim 1, wherein the plurality of magnetically sensitive elements comprises at least two magnetically sensitive elements in a half bridge configuration.

6. The integrated circuit of claim 1, wherein the at least one test conductor is positioned parallel to the at least one magnetically sensitive element, and wherein the at least one test conductor is at least about twenty-five percent as long as the at least one magnetically sensitive element.

7. The integrated circuit of claim 6, wherein the at least one test conductor is positioned within about 5 μm of the at least one magnetically sensitive element.

8. The integrated circuit of claim 1, wherein the integrated circuit has a surface area of less than about 10 mm$^2$.

9. The integrated circuit of claim 1, wherein the integrated circuit includes a plurality of interconnect layers, and wherein the at least one test conductor is formed at an interconnect layer that is closest to the at least one magnetically sensitive element.

10. The integrated circuit of claim 1, wherein the integrated circuit includes a pad coupled to the at least one conductor for supplying a current to the at least one test conductor from an external source.

11. The integrated circuit of claim 1, wherein the at least one test conductor has a width that is less than or equal to about 4 μm.

12. A method of testing a magnetic sensor integrated circuit, comprising:
providing a magnetic sensor integrated circuit having a plurality of magnetically sensitive elements and at least one test conductor positioned within the integrated circuit adjacent to at least one of the magnetically sensitive elements;

causing the integrated circuit to enter a test mode;

generating a current through the at least one test conductor during the test mode, thereby generating a differential magnetic field that is adapted to be applied to the plurality of magnetically sensitive elements;

monitoring an output signal of the integrated circuit while in the test mode;

varying an amplitude of the current through the at least one test conductor; and determining a lowest amplitude of the current that makes the output signal switch states.

13. A method of testing a magnetic sensor integrated circuit, comprising:

providing a magnetic sensor integrated circuit having a plurality of magnetically sensitive elements and at least one test conductor positioned within the integrated circuit adjacent to at least one of the magnetically sensitive elements;

causing the integrated circuit to enter a test mode;

generating a current through the at least one test conductor during the test mode, thereby generating a differential magnetic field that is adapted to be applied to the plurality of magnetically sensitive elements;

monitoring an output signal of the integrated circuit while in the test mode; and applying a homogeneous magnetic field to the magnetic sensor simultaneously with the differential magnetic field.

14. The method of claim 13, and further comprising:
determining a saturation point of the integrated circuit.

15. The method of claim 13, and further comprising:
determining a degree of linearity of the output signal.

16. The method of claim 13, and further comprising:
determining hysteresis characteristics of the integrated circuit.

\* \* \* \* \*